(12) United States Patent
Liu

(10) Patent No.: US 6,948,238 B2
(45) Date of Patent: Sep. 27, 2005

(54) METHOD FOR DISSOCIATING METALS FROM METAL COMPOUNDS

(75) Inventor: Ai-Sen Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 52 days.

(21) Appl. No.: 10/764,608

(22) Filed: Jan. 26, 2004

(65) Prior Publication Data

US 2005/0160591 A1    Jul. 28, 2005

(51) Int. Cl.⁷ .................................................. H05K 3/00
(52) U.S. Cl. ............................ 29/842; 29/825; 29/843; 438/636; 438/660
(58) Field of Search ........................... 29/825, 842, 843; 438/636, 660

(56) References Cited

U.S. PATENT DOCUMENTS

| 5,725,987 A | 3/1998 | Combes et al. |
| 6,132,491 A | 10/2000 | Wai et al. |
| 6,225,210 B1 * | 5/2001 | Ngo et al. ................... 438/624 |
| 6,444,568 B1 * | 9/2002 | Sundararajan et al. ....... 438/627 |

OTHER PUBLICATIONS

Low Temperature Metal-Organic Chemical Vapor Deposition of Tungsten Nitride as Diffusion Barrier for Copper Metallization b J.E. Kelsey et al J. Vacuum Science & Technology B vol. 17, No. 3 pp. 1101-4 May-Jun. 1999.*

* cited by examiner

Primary Examiner—Carl J. Arbes
(74) Attorney, Agent, or Firm—Duane Morris LLP

(57) ABSTRACT

In the forming of copper interconnects for an integrated circuit, a method for dissociating copper oxides from copper surfaces is provided. An antireflective coating layer is formed over an insulating layer formed over a semiconductor substrate. An interconnect pattern is patterned and etched into said insulating layer. A diffusion barrier layer is then conformally deposited in a deposition chamber along the etched interconnect pattern, wherein the antireflective coating is removed in said chamber before deposition of the barrier layer. Copper interconnects are formed in the interconnect pattern etched in the insulating layer. A supercritical fluid is then provided on the insulating layer. The supercritical fluid is then treated to dissociate the copper oxides from the copper surfaces.

9 Claims, No Drawings

METHOD FOR DISSOCIATING METALS FROM METAL COMPOUNDS

FIELD OF THE INVENTION

The present invention relates to semiconductor fabrication techniques and structures, and more particularly to methods of dissociating metals from metal compounds in the forming of same.

BACKGROUND OF THE INVENTION

Integrated circuits formed on semiconductor substrates typically include several metal layers that electrically interconnect the devices formed therein. The different metal layers are separated by insulating layers known as interlevel (or interlayer) dielectric layers (ILD) that have etched via holes (also known as vias) therein to connect devices or active regions from one layer of metal to the next.

Copper (Cu) interconnects are increasingly used for high density devices because of copper's improved conductivity relative to conventional materials such as aluminum (Al), and aluminum-copper alloy (Al—Cu). The use of copper as the interconnect material presents various fabrication problems. First, there is currently no production-worthy etch process for copper. The damascene and dual damascene approaches have developed to address this shortcoming. A brief description of the dual damascene process is provided hereafter as described, for example, in U.S. Pat. No. 6,444,568 to Sundararajan et al., entitled "Method of Forming Copper Diffusion Barrier", the entirety of which is hereby incorporated herein by reference.

In the dual damascene process, an insulating layer is deposited over a copper layer. The insulating layer is then patterned to form a two-step connection having a narrower lower portion (referred to as a via portion) exposing selected connection areas on the underlying patterned metal layer and a wider upper portion (referred to as a trench portion) that serves to form the next layer of metal lines. The trench or the via portion can be formed first. Copper is then deposited to fill the two-step connection. A top portion of the copper layer is then removed using a chemical mechanical polishing (CMP) process. The resultant structure includes a via (the copper filled via portion) that connects the underlying metal layer with an overlying copper line (the copper filled trench portion). The contacts from the first copper metal layer to the devices are usually made with Tungsten (W) plugs.

When copper is used for these interconnects, the copper atoms must be prevented from migrating or diffusing into adjacent interlayer dielectric layers to prevent compromise of the integrity of the dielectric layers, particularly at low temperatures and under accelerated electric fields. Therefore, a dielectric diffusion barrier (DDB) is typically formed between the top of the copper metal line or layer and a subsequently deposited ILD to prevent this migration. Likewise, the copper metal line may be encapsulated with a diffusion barrier to prevent migration into a surrounding inter-metal dielectric (IMD) layer.

Currently, refractory metals such as Tantalum and Titanium and their nitrided compounds, i.e., TaN and TiN, are employed as the metal barrier against copper penetration into $SiO_2$ and low-k interlayer dielectric layers. As device sizes decrease to 0.1 $\mu$m and below, however, the main advantage of using low-resistance copper interconnects begins to be negated by the higher resistance metal barrier layers, resulting in an increase in RC time delay. Still further, as these refractory metal barrier layers become increasingly thinner, reliability concerns such as line—line leakage, time-dependent dielectric breakdown (TDDB) lifetime and BTS (Bias-Temperature Stress) leakage arise due to poor barrier integrity.

Therefore, there remains a need for an improved low resistance copper interconnect structure and method of manufacturing the same in integrated circuit devices. More particularly, a need exists for methods of dissociating metals from metal compounds in the forming of same.

SUMMARY OF THE INVENTION

In the forming of copper interconnects for an integrated circuit, a method for dissociating copper oxides from copper surfaces is provided. An antireflective coating layer is formed over an insulating layer formed over a semiconductor substrate. An interconnect pattern is patterned and etched into said insulating layer. A diffusion barrier layer is then conformally deposited in a deposition chamber along the etched interconnect pattern, wherein the antireflective coating is removed in said chamber before deposition of the barrier layer. Copper interconnects are formed in the interconnect pattern etched in the insulating layer. A supercritical fluid is then provided on the insulating layer. The supercritical fluid is then treated to dissociate the copper oxides from the copper surfaces.

In another embodiment of a method of forming copper interconnects for an integrated circuit, an interconnect pattern is patterned and etched in a low-k dielectric insulating layer. A dielectric diffusion barrier layer is conformally deposited over the etched insulating layer and along the etched interconnect pattern. A layer of copper is deposited over the diffusion barrier layer formed over the insulating layer and in the etched interconnect pattern. The deposited copper layer is then polished down to the diffusion barrier layer formed over the insulating layer.

The above and other features of the present invention will be better understood from the following detailed description of the preferred embodiments of the invention.

DETAILED DESCRIPTION OF THE INVENTION

A damascene based method of forming a copper interconnect structure is described in application Ser. No. 10/337,684, the entirety of which is hereby incorporated herein by reference, equally applicable to both damascene and dual damascene fabrication techniques.

Suitable fluids and/or supercritical fluids for use in the present invention include, without limitation, carbon dioxide, nitrogen, nitrous oxide, methane, ethylene, propane and propylene. Carbon dioxide is a particularly preferred fluid for both subcritical and supercritical fluid extractions because of its moderate chemical constants ($T_C$=31° C., $P_C$73 atm) and its inertness (i.e., it is non-explosive and thoroughly safe for extractions, even extractions performed at supercritical conditions). Carbon dioxide also is a preferred solvent because it is abundantly available and relatively inexpensive.

FIG. 1 from U.S. Pat. No. 6,132,491, herein incorporated by reference, is a phase diagram for carbon dioxide, and shows the conditions necessary to produce either subcritical liquid carbon dioxide or supercritical carbon dioxide. All conditions above the triple point ($T_P$) produce a supercritical carbon dioxide fluid solvent, and most such conditions are effective for practicing the present invention.

Alternatively, liquid $CO_2$ may be suitable for practicing the method of the present invention. At room temperature carbon dioxide becomes a liquid above 5.1 atm. Depending on the pressure, liquid carbon dioxide has a density comparable or slightly greater than supercritical carbon dioxide, thus the solvation power of liquid carbon dioxide is comparable to that of supercritical carbon dioxide. This means liquid carbon dioxide also should be able to dissolve or suspend, preferably dissolve, the metal and metalloid compounds described above. However, liquid carbon dioxide does not have the "gas-like" properties of supercritical carbon dioxide. Therefore, liquid carbon dioxide has a large viscosity, small diffusivity, and consequently poor penetration power compared with the supercritical carbon dioxide.

The fluid solvents of the present invention may be used either individually or in combinations, as mixed fluids or supercritical fluid solvents. Examples of suitable fluids, and their critical temperature and pressure, are provided in U.S. Pat. No. 6,132,491, the entirety of which is hereby incorporated herein by reference.

While this invention has been described with respect to particular embodiments thereof, it is apparent that numerous other forms and modifications of the invention will be obvious to those skilled in the art. The appended claims and this invention generally should be construed to cover all such obvious forms and modifications which are within the true spirit and scope of the present invention.

What is claimed is:

1. In the forming of copper interconnects for an integrated circuit, a method for dissociating copper oxides from copper surfaces, comprising the steps of:

providing a substrate with an insulating layer formed over said substrate;

forming an interconnect pattern in said insulating layer;

conformally depositing a barrier layer along said interconnect pattern;

forming copper interconnects in said interconnect pattern; and providing a supercritical fluid over said copper interconnect pattern in said insulating layer.

2. The method of claim 1, wherein treating the supercritical fluid comprises changing the oxidation state of copper to dissociate the copper oxides from the copper surfaces.

3. The method of claim 1, further comprising providing a supercritical fluid selected from the group consisting of oxidizing agents and reducing agents, and changing the oxidation state of the metal with the supercritical fluid.

4. The method of claim 1, further comprising the step of baking an antireflective coating layer, whereby said antireflective coating layer is removed.

5. The method of claim 4, wherein said baking step is at a temperature between about 350–400° C. for about 30–60 seconds.

6. The method of claim 1, wherein said barrier layer is deposited using plasma enhanced chemical vapor deposition, thermal chemical vapor deposition or atomic layer deposition.

7. The method of claim 1, wherein said insulating layer includes a low-k dielectric material.

8. The method of claim 1, wherein said barrier layer includes a dielectric material.

9. The method of claim 8, wherein said barrier layer includes a dielectric material selected from the group consisting of SiC, SiCN, SiCO and SiN.

* * * * *